United States Patent
Namiki et al.

(10) Patent No.: US 8,374,032 B2
(45) Date of Patent: *Feb. 12, 2013

(54) NON-VOLATILE SEMICONDUCTOR MEMORY DEVICE

(75) Inventors: Yuko Namiki, Yokohama (JP); Takuya Futatsuyama, Yokohama (JP); Yuui Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/161,147

(22) Filed: Jun. 15, 2011

(65) Prior Publication Data

US 2011/0242892 A1    Oct. 6, 2011

Related U.S. Application Data

(63) Continuation of application No. 12/363,963, filed on Feb. 2, 2009, now Pat. No. 7,965,555.

(30) Foreign Application Priority Data

Feb. 14, 2008  (JP) .................................. 2008-032820

(51) Int. Cl.
     *G11C 16/00*   (2006.01)
(52) U.S. Cl. ......... 365/185.17; 365/185.02; 365/185.18; 365/185.2
(58) Field of Classification Search .............. 365/185.02
     See application file for complete search history.

(56) References Cited

U.S. PATENT DOCUMENTS

| 6,330,189 | B1 | 12/2001 | Sakui et al. |
| 7,009,881 | B2 * | 3/2006 | Noguchi .................. 365/185.17 |
| 7,760,550 | B2 | 7/2010 | Fayrushin et al. |
| 7,916,547 | B2 * | 3/2011 | Hosono .................... 365/185.21 |
| 7,965,555 | B2 * | 6/2011 | Namiki et al. ........... 365/185.17 |
| 2007/0279994 | A1 | 12/2007 | Mokhlesi et al. |
| 2007/0279995 | A1 | 12/2007 | Mokhlesi et al. |

FOREIGN PATENT DOCUMENTS

| JP | 2002-133888 | 5/2002 |
| JP | 2004-127346 | 4/2004 |
| JP | 2005-100501 | 4/2005 |
| WO | WO 2007/143398 A2 | 12/2007 |

OTHER PUBLICATIONS

Japanese Office Action issued May 15, 2012, in Patent Application No. 2008-032820 (with English-language translation).

* cited by examiner

*Primary Examiner* — Tan T. Nguyen
(74) *Attorney, Agent, or Firm* — Oblon, Spivak, McClelland, Maier & Neustadt, L.L.P.

(57) ABSTRACT

A non-volatile semiconductor memory device including: a NAND string having multiple memory cells connected in series and first and second select gate transistors disposed on the both ends; word lines coupled to the memory cells; and first and second select gate lines coupled to the first and second select gate transistors, wherein a data read mode is defined by the following bias condition: a selected word line is applied with a read voltage; one adjacent to the selected word line within first unselected word lines disposed on the first select gate line side is applied with a first read pass voltage while the others are applied with a second read pass voltage lower than the first read pass voltage; and second unselected word lines disposed on the second select gate line side are applied with a third read pass voltage higher than the first read voltage.

13 Claims, 15 Drawing Sheets

NON-VOLATILE SEMICONDUCTOR MEMORY DEVICE

CROSS-REFERENCE TO RELATED APPLICATION

This application is a continuation application of U.S. application Ser. No. 12/363,963, filed Feb. 2, 2009, now U.S. Pat. No. 7,965,555 which is based on and claims the benefit of priority from the prior Japanese Patent Application No. 2008-032820, filed on Feb. 14, 2008, the entire contents of which are incorporated herein by reference.

BACKGROUND OF THE INVENTION

1. Field of the Invention

This invention relates to a non-volatile semiconductor memory device (EEPROM), specifically to a data read method of a NAND-type flash memory, in which multiple memory cells are connected in series to constitute a NAND string.

2. Description of the Related Art

A NAND-type flash memory is well known as one of EEPROMs, which is easily achieving a high integration. In a data read mode of the NAND-type flash memory, unselected memory cells in a NAND string are made to operate as pass transistors, and it will be detected the on/off state of a selected cell. That is, the selected cell is applied with a read voltage necessary for judging the cell threshold distribution, and the remaining unselected cells are applied with a read pass voltage that turns on cells without regard to cell data, whereby data is judged in accordance with whether the precharged bit line is discharged or not.

As the integration of the above-described NAND-type flash memory progresses, the reliability of read data becomes problematic. Specifically, the capacitive coupling between adjacent cells influences the read operation. For example, it will be generated such a situation that the floating gate potential in an unselected cell adjacent to a selected cell is not raised sufficiently, and this unselected cell becomes disable to carry a sufficient cell current as a pass transistor. Especially, unselected cells disposed on the lower course side of the selected cell (i.e., on the source line side of the selected cell) are problematic because these are set in a high channel resistance state due to negative feedback serving for lowering the cell current. This cell current decrease at a data read time causes the erroneous read and increasing of the sensing time.

With respect to highly integrated NAND-type flash memories, there have already been some proposals, in which the influences of capacitive coupling between adjacent cells are considered. For example, refer to JP-A-2002-133888. In this application, there is shown that an unselected word line adjacent to a selected word line is applied with a read pass voltage set to be lower than that of the other unselected word lines at a write verify-read time.

SUMMARY OF THE INVENTION

According to an aspect of the present invention, there is provided a non-volatile semiconductor memory device including:

a NAND string, in which a plurality of memory cells are connected in series and first and second select gate transistors are disposed on the both ends for coupling them to a bit line and a source line, respectively;

a plurality of word lines coupled to the respective control gates of the memory cells; and first and second select gate lines coupled to the gates of the first and second select gate transistors, respectively, wherein a data read mode is defined by the following bias condition: a selected word line is applied with a read voltage; one adjacent to the selected word line within first unselected word lines disposed on the first select gate line side of the selected word line is applied with a first read pass voltage while the others are applied with a second read pass voltage lower than the first read pass voltage; and second unselected word lines disposed on the second select gate line side of the selected word line are applied with a third read pass voltage higher than the first read voltage.

According to another aspect of the present invention, there is provided a non-volatile semiconductor memory device including:

a NAND string, in which a plurality of memory cells are connected in series and first and second select gate transistors are disposed on the both ends for coupling them to a bit line and a source line, respectively;

a plurality of word lines coupled to the respective control gates of the memory cells; and first and second select gate lines coupled to the gates of the first and second select gate transistors, respectively, wherein a data read mode is defined by the following bias condition: a selected word line is applied with a read voltage; one adjacent to the selected word line within first unselected word lines disposed on the first select gate line side of the selected word line is applied with a first read pass voltage while the others are applied with a second read pass voltage lower than the first read pass voltage; and second unselected word lines disposed on the second select gate line side of the selected word line are applied with the first read pass voltage.

According to still another aspect of the present invention, there is provided a non-volatile semiconductor memory device including:

a NAND string, in which a plurality of memory cells are connected in series and first and second select gate transistors are disposed on the both ends for coupling them to a bit line and a source line, respectively;

a plurality of word lines coupled to the respective control gates of the memory cells; and first and second select gate lines coupled to the gates of the first and second select gate transistors, respectively, wherein a data read mode is defined by the following bias condition: a selected word line is applied with a read voltage; one adjacent to the selected word line within first unselected word lines disposed on the first select gate line side of the selected word line is applied with a first read pass voltage while the others are applied with a second read pass voltage lower than the first read pass voltage; and one adjacent to the selected word line within second unselected word lines disposed on the second select gate line side of the selected word line are applied with third read pass voltage higher than the first read pass voltage while the others are applied with the first read pass voltage.

DETAILED DESCRIPTION OF THE EMBODIMENTS

Illustrative embodiments of this invention will be explained with reference to the accompanying drawings below.

Figure 8:
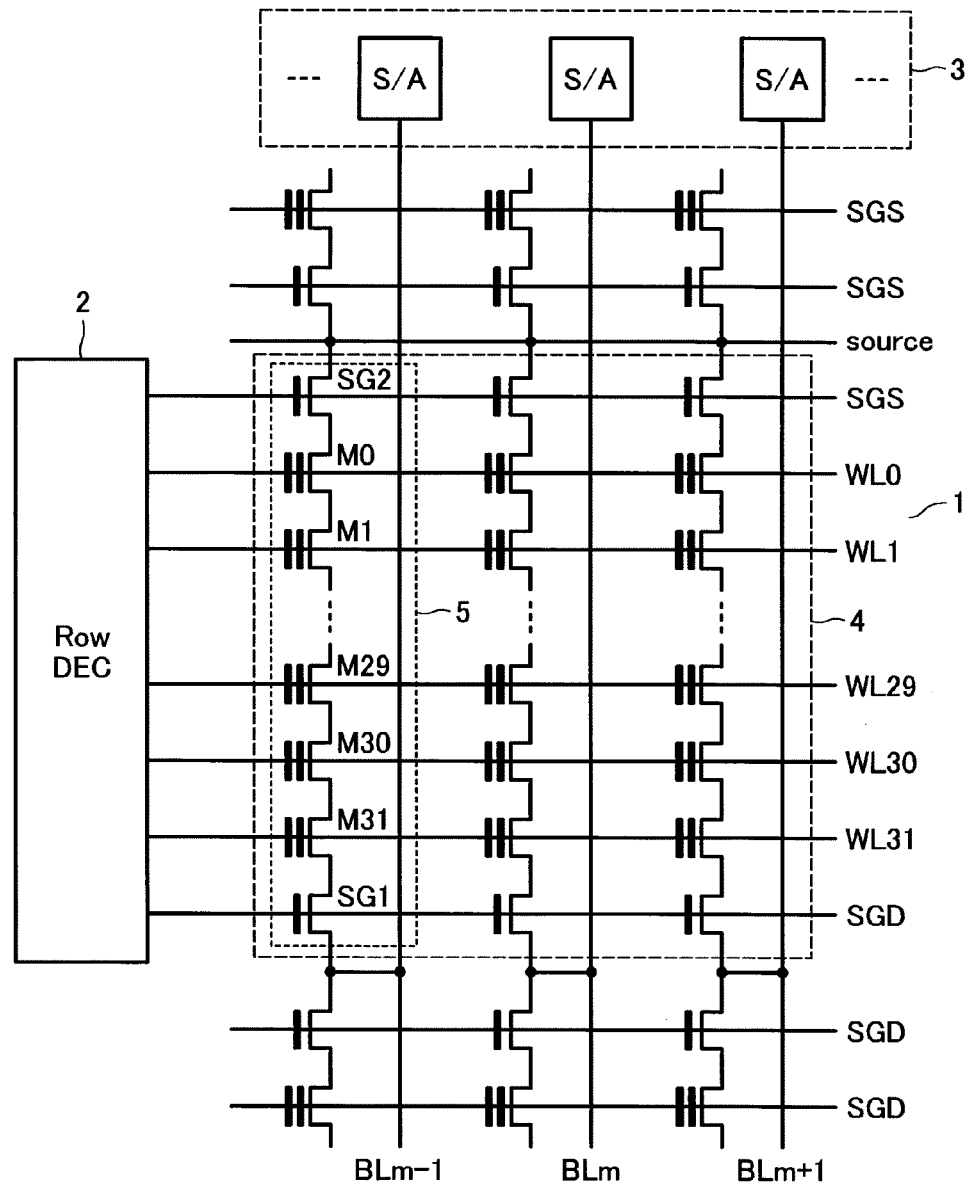
FIG. 8 shows a memory core of a NAND-type flash memory in accordance with the present invention.

FIG. 8 shows an equivalent circuit of a memory core of a NAND-type flash memory in accordance with an embodiment. Memory cell array 1 has NAND strings (i.e., NAND cell units) 5 arranged therein, in each of which a plurality of memory cells are connected in series. In this example, a NAND string has thirty two memory cells M0-M31 connected in series. One end of the NAND string is coupled to a bit line BL via select gate transistor SG1; and the other to a common source line CELSRC via select gate transistor SG2.

Control gates of the memory cells M0-M31 are coupled to word lines WL0-WL31, respectively; and gates of the select gate transistors SG1 and SG2 to select gate lines SGD and SGS, respectively.

Disposed for selectively driving the word lines WL0-WL31 and select gate lines SGD and SGS is a row decoder 2. Bit lines are coupled to the sense amplifiers S/A constituting a page buffer 3. A set of NAND strings sharing word lines is defined as a block 4, which serves as an erase unit. Multiple blocks are arranged in the bit line direction.

Figure 9:
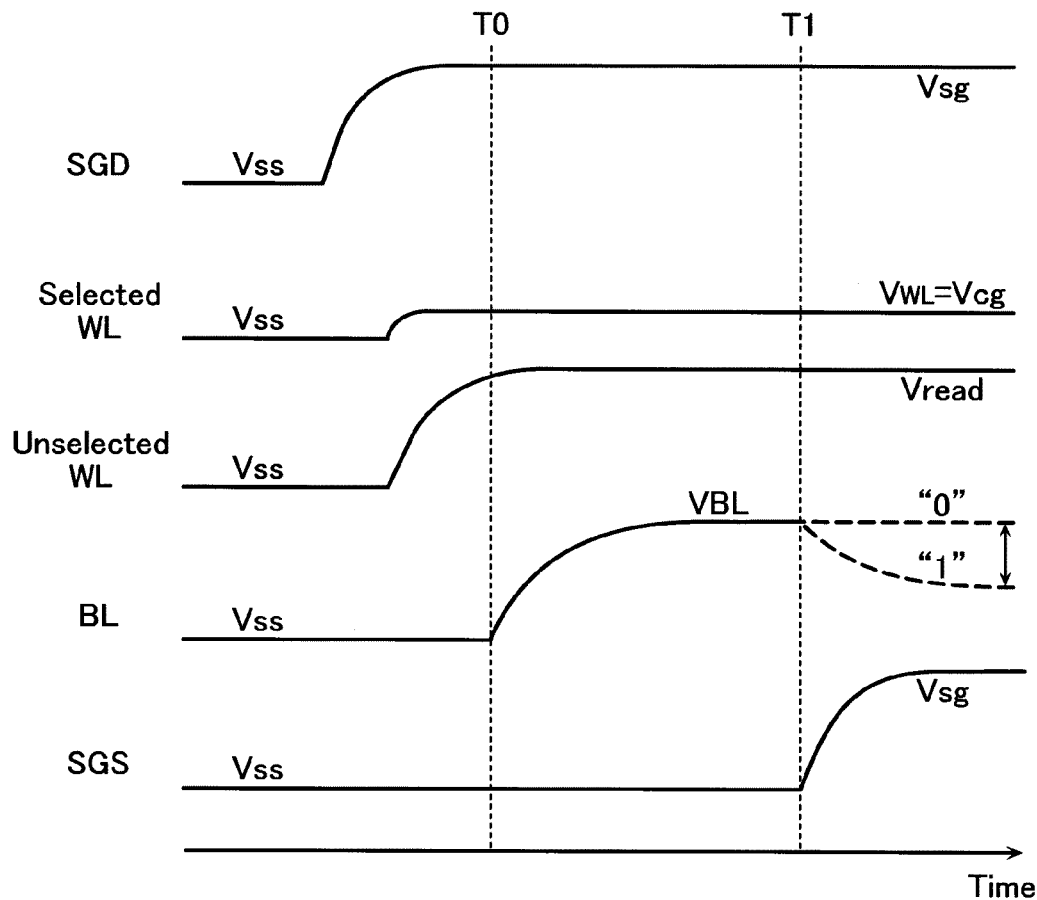
FIG. 9 shows the voltage waveforms in a normal data read mode in the flash memory.
Figure 10:
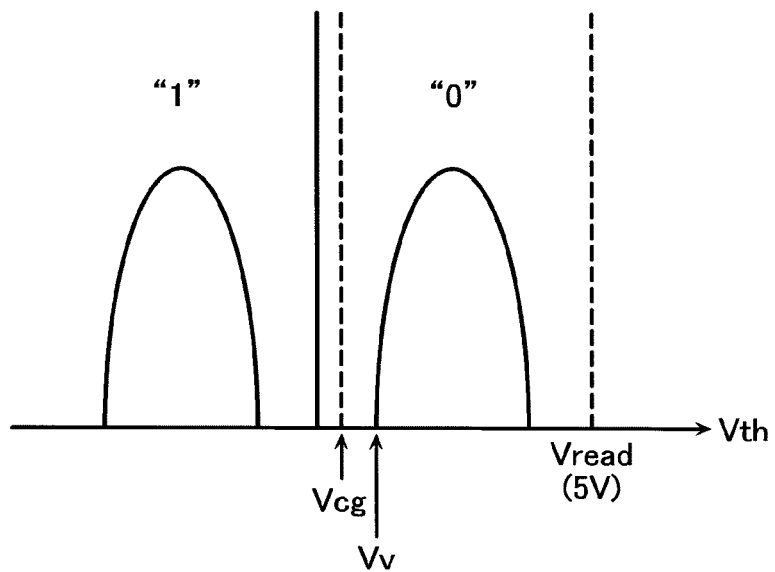
FIG. 10 shows the binary data threshold distribution of the flash memory.

FIG. 9 shows voltage waveforms used in a read operation of a usual NAND-type flash memory. It is assumed here that the binary data threshold distribution shown in FIG. 10 is used. As shown in FIG. 9, bit line precharge is performed (timing T0) under the condition that a selected word line is applied with read voltage Vcg (e.g., 0.4V); unselected word lines are applied with read pass voltage Vread (e.g., 5V); and select gate line SGD on the bit line side is applied with voltage Vsg for turning on the select gate transistor (e.g., 4V), so that the bit line is precharged up to a certain bit line voltage VBL (e.g., 1V).

As shown in FIG. 10, the read voltage Vcg is set between the cell threshold distributions of data "0" and "1", i.e., set in such a state that cell current flows in a data "1" cell (erased cell) while cell current does not flow in a data "0" cell (programmed or written cell). Read pass voltage Vread is set at a level necessary for sufficiently turning on cells without regard to cell data.

After the bit line precharge, the select gate line SGS on the source line side is applied with Vsg for turning the select gate transistor (timing T1). As a result, if the selected cell is data "1", the NAND string becomes conductive, and the bit line is discharged while if the selected cell is data "0", the bit line will not be discharged. Detect whether the bit line is discharged or not (or whether the amount of the bit line discharge is large or not), and it becomes possible to judge the cell data.

There is a problem in the above-described read operation as follows. As the high integration progresses, the distance between word lines is narrowed. On the other hand, there is a limitation for thinning the gate insulating film when taking into consideration of the reliability of cell properties. Therefore, capacitive coupling increases between adjacent word lines, or between word lines and adjacent cells' floating gates.

Figure 11:
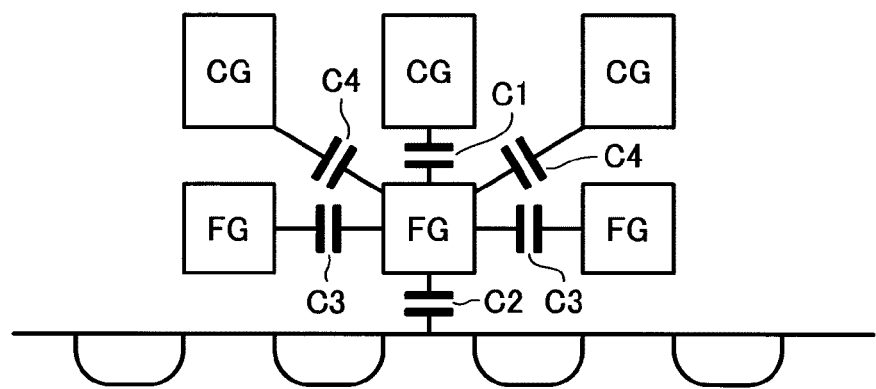
FIG. 11 shows the capacitive coupling situation between cells in a NAND string.

FIG. 11 shows the situation of capacitive coupling between adjacent word lines in a NAND string. A floating gate (FG) is coupled to a control gate (CG) (i.e., word line) disposed above it with capacitance C1, and coupled to the cell channel with capacitance C2. In addition, a floating gate is coupled to the adjacent floating gate and control gate thereabove with capacitances C3 and C4, respectively. If capacitances C3 and C4 become large as being not ignorable in comparison with capacitances C1 and C2, these influence the cell data read operation.

Figure 12:
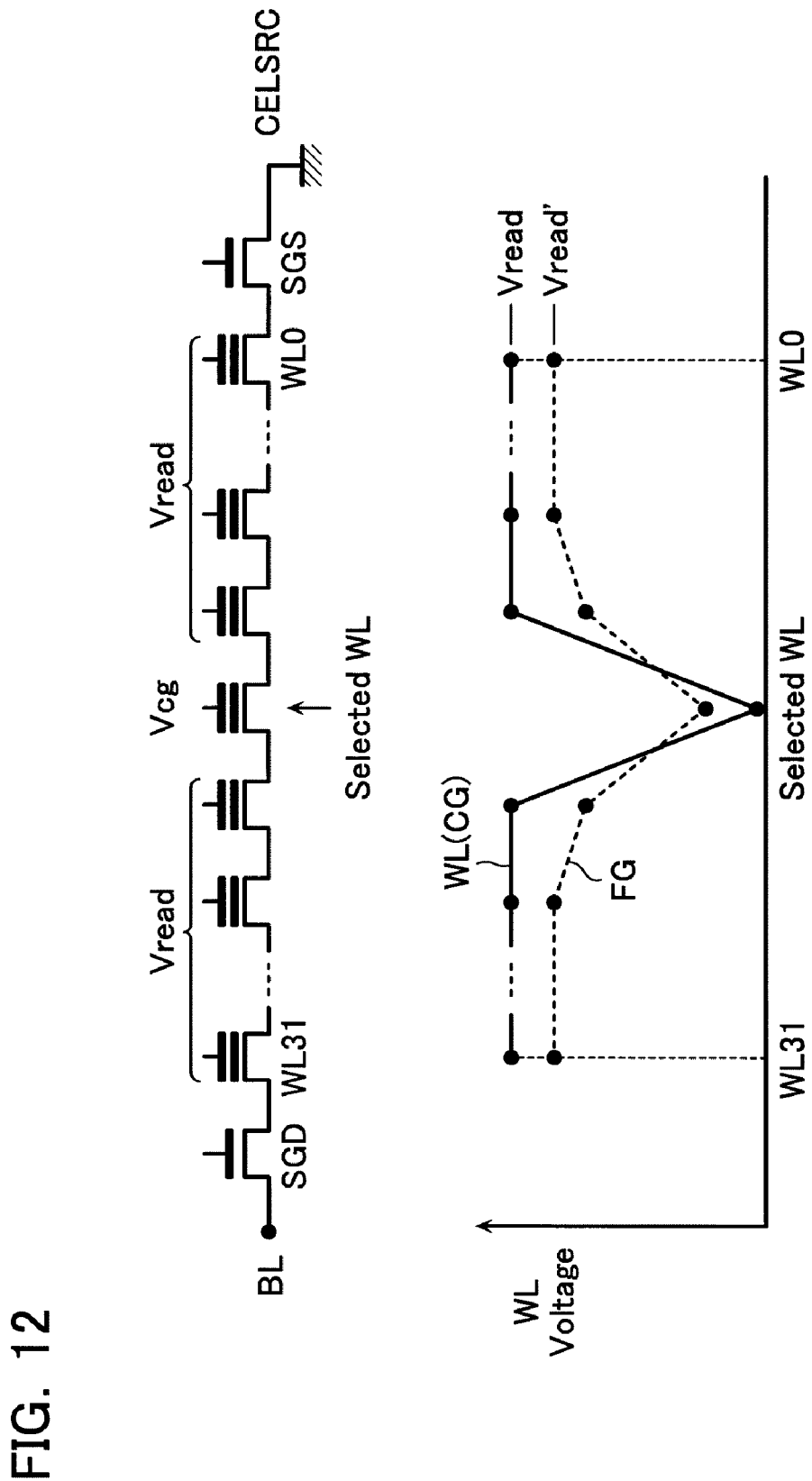
FIG. 12 shows a voltage distribution in a NAND string at a normal read time.

FIG. 12 shows voltage distributions of word lines WL (i.e., control gates CG) and floating gates FG in a NAND string in case the whole unselected word lines are applied with read pass voltage Vread.

Since the voltage of the floating gate FG is primarily defined by the capacitance division between the control gate CG and the cell channel, the floating gate FG of the unselected cell will be set at Vread' (<Vread). However, considering an unselected cell disposed on the bit line side or on the source line side to be adjacent to the selected cell (such the unselected cell will be referred to as a "adjacent-unselected cell", hereinafter), the floating gate FG is lowered in level substantially due to the capacitive coupling from the selected cell. While, the voltage of the floating gate of the selected cell will be boosted under the influence of the adjacent-unselected cell. Therefore, there is generated such a situation that the adjacent-unselected cell is not turned on sufficiently, and the selected cell also is not turned on sufficiently even if the cell data is "1".

In this embodiment, the read pass voltage applied to the unselected word lines is suitably set, and the reliability of the data read operation is improved. In correspondence to the above-described "adjacent-unselected cell", the unselected word line coupled to this cell will be referred to as an "adjacent-unselected word line" hereinafter.

The details of the embodiment will be explained below.

[Embodying Mode 1]

Figure 1:
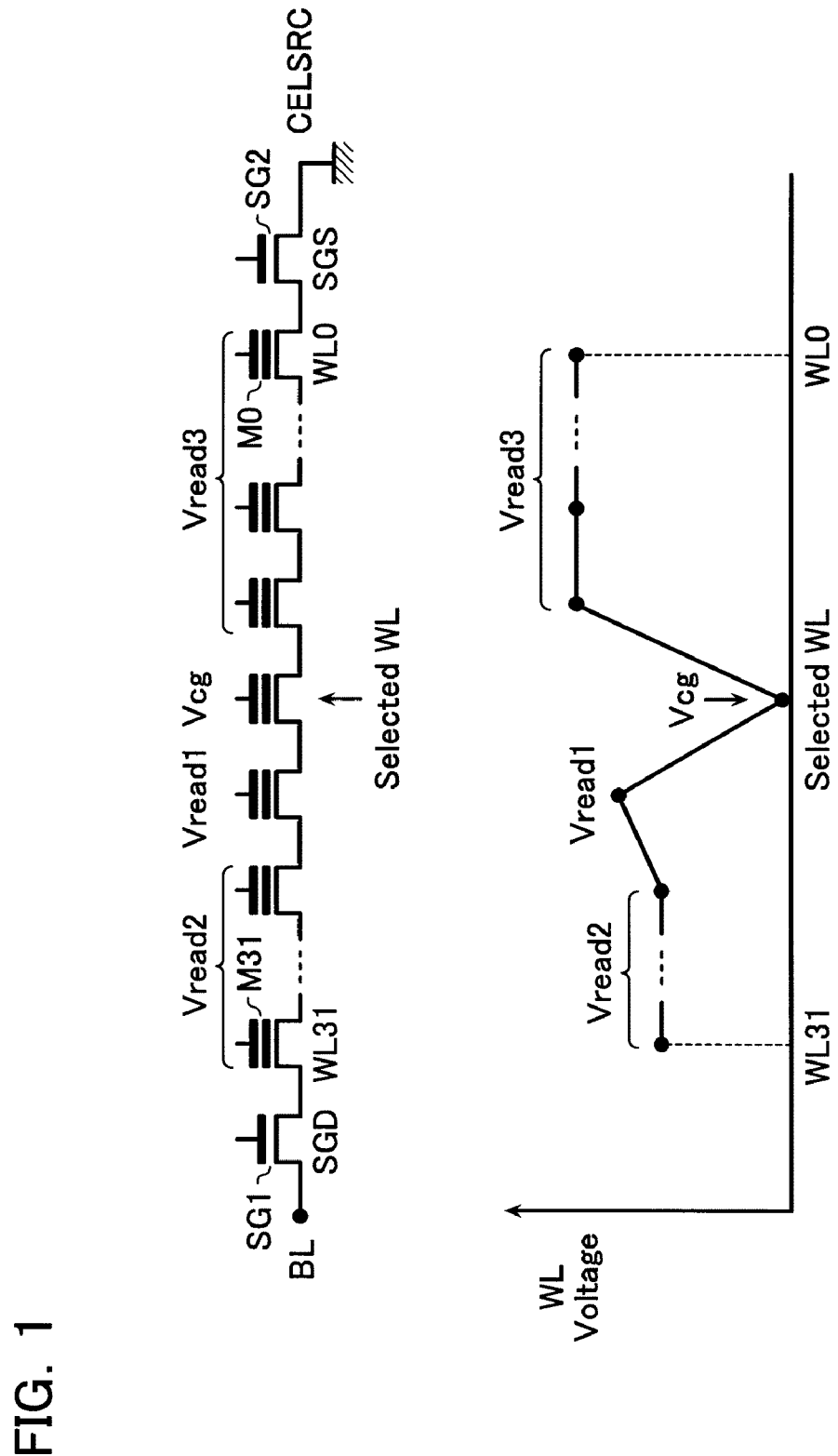
FIG. 1 shows a voltage distribution in a NAND string at a read time in accordance with embodying mode 1.

FIG. 1 shows a voltage distribution in a NAND string at a data read time in accordance with embodying mode 1. The selected word line is applied with read voltage Vcg set between cell data threshold distribution to be read and the adjacent threshold distribution. Unselected word lines disposed on the bit line (BL) contact side (i.e., on the select gate line SGD side) of the selected word line are set as follows: one adjacent-unselected word line adjacent to the selected word line is applied with read pass voltage Vread1; and the other unselected word lines are applied with read pass voltage Vread2 set to be lower than Vread1. All unselected word lines disposed on the source line (CELSRC) contact side (i.e., to on the select gate line SGS side) are applied with read pass voltage Vread3 set to be higher than Vread1.

This will be explained in other words as follows. Assuming that read pass voltage Vread2 is equal to Vread usually used as a uniform read pass voltage as explained with reference to FIG. 12, read pass voltage Vread1 higher than Vread is applied to the adjacent-unselected word line on the select gate line SGD side, and read pass voltage Vread3 higher than Vread1 is applied to all unselected word lines on the select gate line SGS side.

With these read pass voltages applied, the voltage drop of the floating gate under the adjacent-unselected word line due to capacitive coupling from the selected cell is suppressed, so that the adjacent-unselected cell will be turned on sufficiently. Especially, as a result of that unselected word lines on the select gate line SGS side are applied with sufficiently high read pass voltage Vread3, it is suppressed such a back gate effect (i.e., negative feed-back effect) that the source potential of the selected cell is boosted due to the channel resistance on the source side, and this makes possible to carry a sufficient cell current in the NAND string.

As a result, the read margin increases, i.e., the reliability of data read operation will be improved, and it becomes possible to shorten the sensing time.

Figure 4:
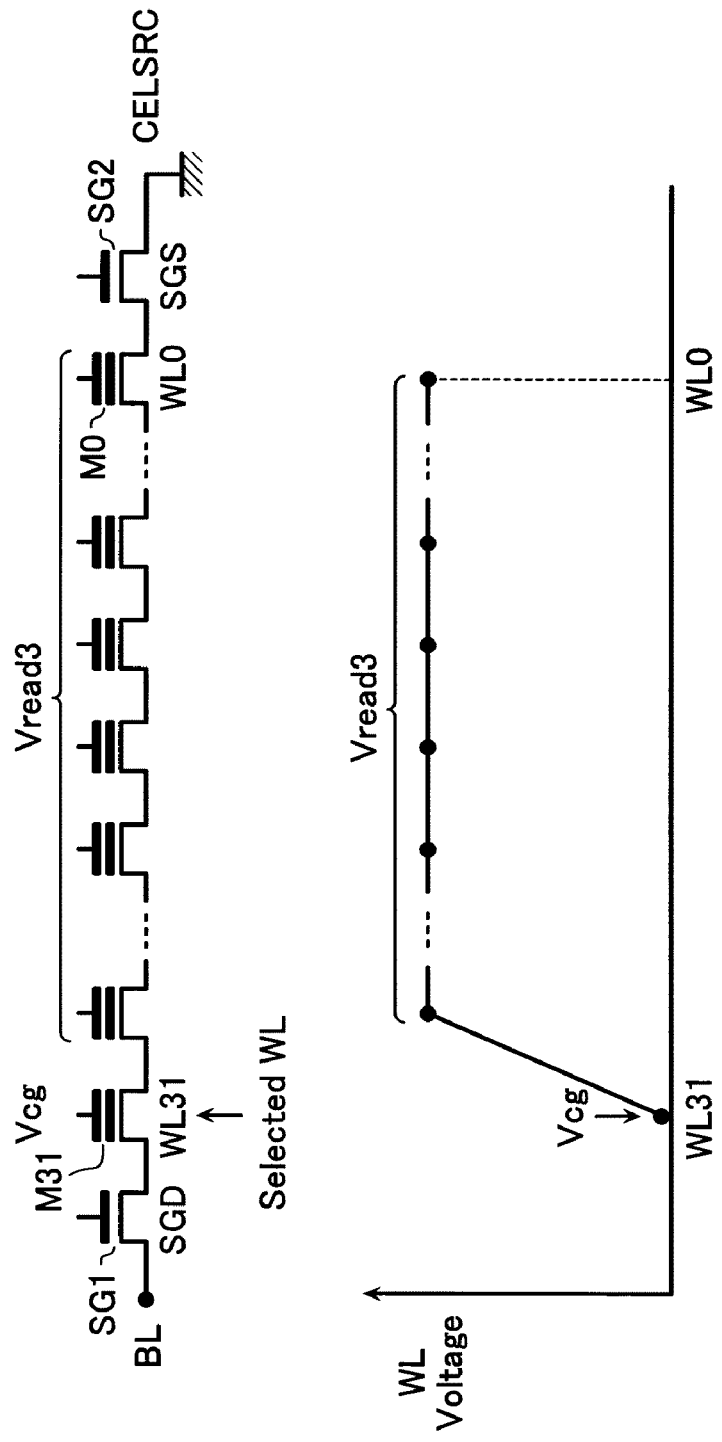
FIG. 4 shows a voltage distribution in a NAND string in case the word line nearest to the bit line side select gate line is selected.

As shown in FIG. 4, when word line WL31 nearest to the select gate line SGD is selected, all unselected word lines are applied with read pass voltage Vread3 shown in FIG. 1. As a result, the channel resistance on the source side of the selected cell is sufficiently lowered, so that the cell current may be made to be sufficiently large.

Figure 5:
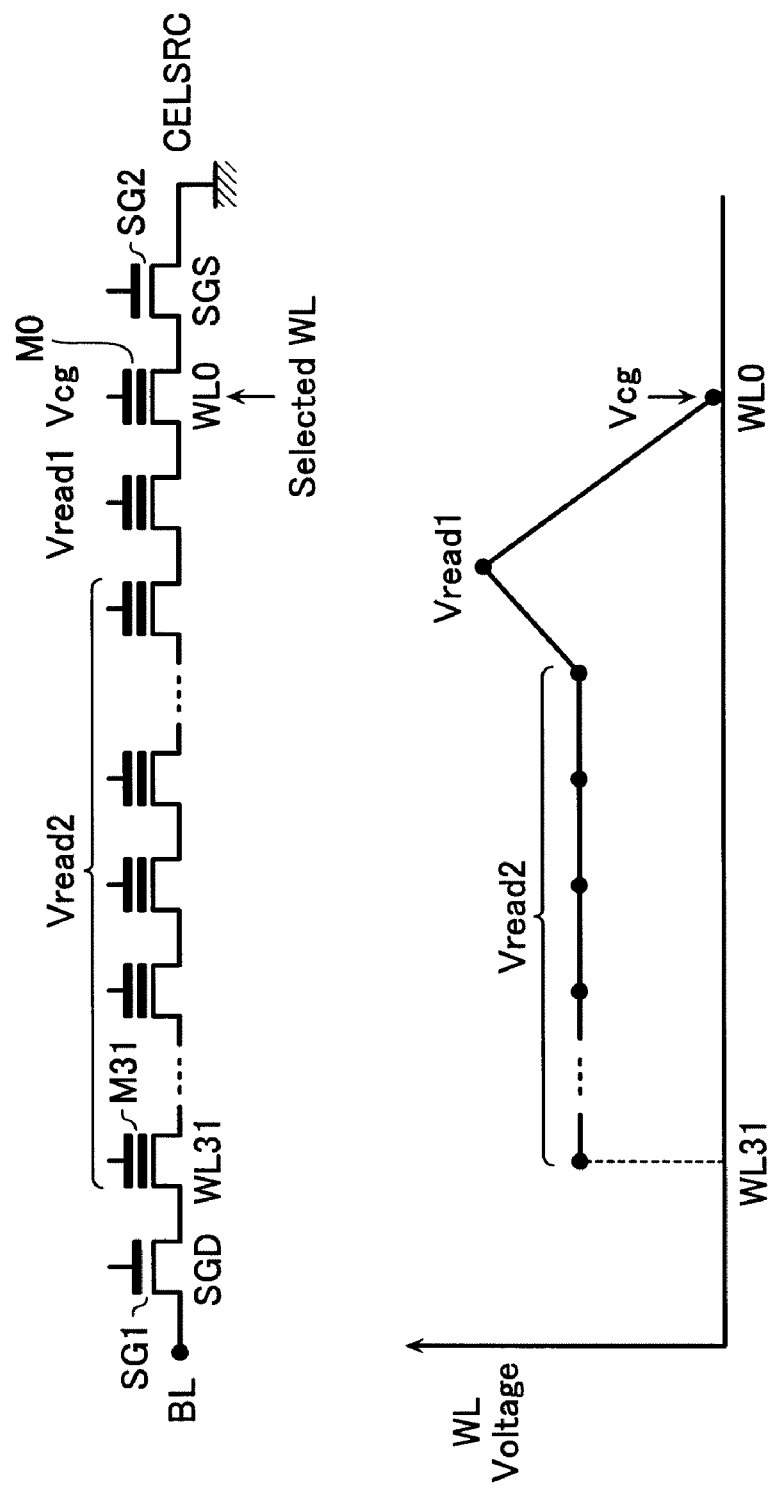
FIG. 5 shows a voltage distribution in a NAND string in case the word line nearest to the source line side select gate line is selected.

As shown in FIG. 5, when word line WL0 nearest to the select gate line SGS is selected, adjacent-unselected word line is applied with read pass voltage Vread1; and the other unselected word lines with read pass voltage Vread2 lower than Vread1. This relationship is the same as that shown in FIG. 1. As a result, the floating gate voltage drop of the adjacent-unselected cell is suppressed, and a sufficiently large cell current flows.

[Embodying Mode 2]

Figure 2:
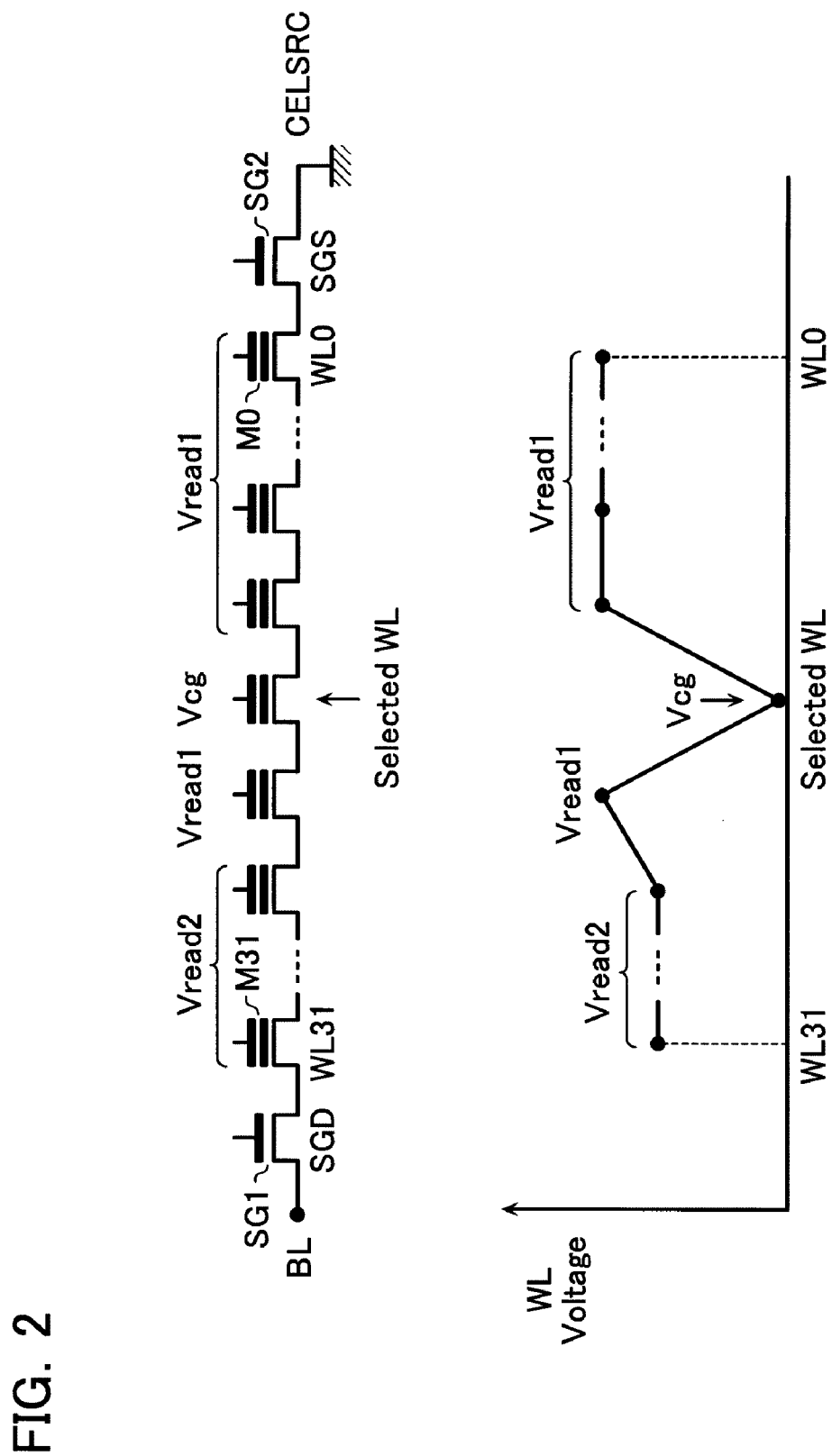
FIG. 2 shows a voltage distribution in a NAND string at a read time in accordance with embodying mode 2.

FIG. 2 shows a voltage distribution in a NAND string at a data read time in accordance with embodying mode 2. The selected word line is applied with read voltage Vcg set between cell data threshold distribution to be read and the adjacent threshold distribution. Unselected word lines disposed on the bit line (BL) contact side (i.e., on the select gate line SGD side) of the selected word line are set as follows: one adjacent-unselected word line adjacent to the selected word line is applied with read pass voltage Vread1; and the other unselected word lines are applied with read pass voltage Vread2 lower than Vread1. All unselected word lines disposed on the source line (CELSRC) contact side (i.e., on the select gate line SGS side) are applied with read pass voltage Vread1.

This will be explained in other words as follows. Assuming that read pass voltage Vread2 is equal to Vread usually used as a uniform read pass voltage as explained with reference to FIG. 12, read pass voltage Vread1 higher than Vread is applied to the adjacent-unselected word line on the select gate line SGD side and all unselected word lines on the select gate line SGS side.

As a result, as similar to the embodying mode 1, a sufficiently large cell current is secured, and the reliability of data read operation will be achieved. It is an advantageous effect that the number of read pass voltages is less than that in the embodying mode 1.

[Embodying Mode 3]

Figure 3:
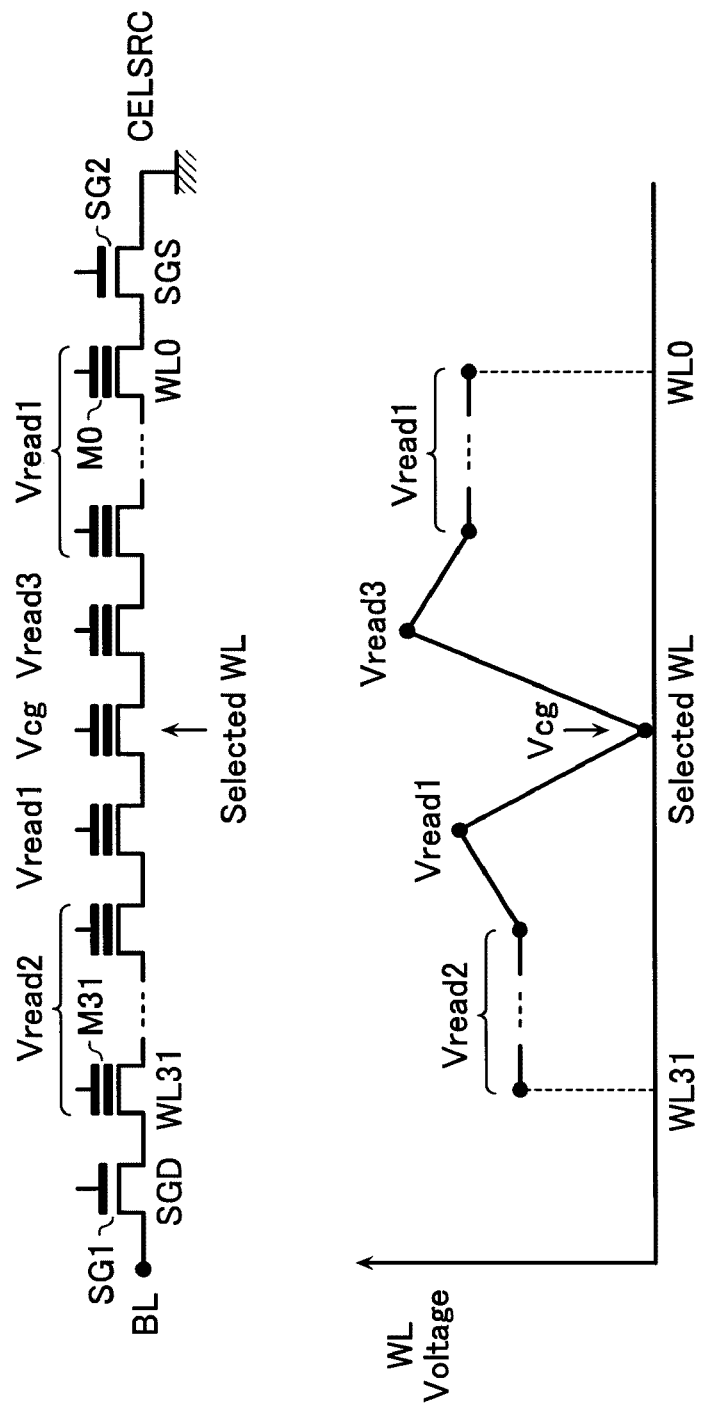
FIG. 3 shows a voltage distribution in a NAND string at a read time in accordance with embodying mode 3.

FIG. 3 shows a voltage distribution in a NAND string at a data read time in accordance with embodying mode 3. The selected word line is applied with read voltage Vcg set between cell data threshold distribution to be read and the adjacent threshold distribution. Unselected word lines disposed on the bit line (BL) contact side (i.e., on the select gate line SGD side) of the selected word line are set as follows: one adjacent-unselected word line adjacent to the selected word line is applied with read pass voltage Vread1; and the other unselected word lines are applied with read pass voltage Vread2 lower than Vread1.

By contrast, unselected word lines disposed on the source line (CELSRC) contact side (i.e., on the select gate line SGS side) of the selected word line are set as follows: one adjacent-unselected word line adjacent to the selected word line is applied with read pass voltage Vread3 higher than Vread1; and the other unselected word lines are applied with read pass voltage Vread1.

What is different from the embodying mode 1 shown in FIG. 1 is as follows: in contrast to that all unselected word line on the select gate line SGS side are applied with read pass voltage Vread3 in the embodying mode 1, only adjacent-unselected word line is applied with Vread3 in this embodying mode 3. According to this embodying mode 3, it is able to suppress the channel resistance increase of the adjacent-unselected cell, which has the largest influence to the source resistance of the selected cell in the whole unselected cells on the select gate line SGS side, so that the read property may be sufficiently improved.

[Embodying Mode 4]

Figure 6:
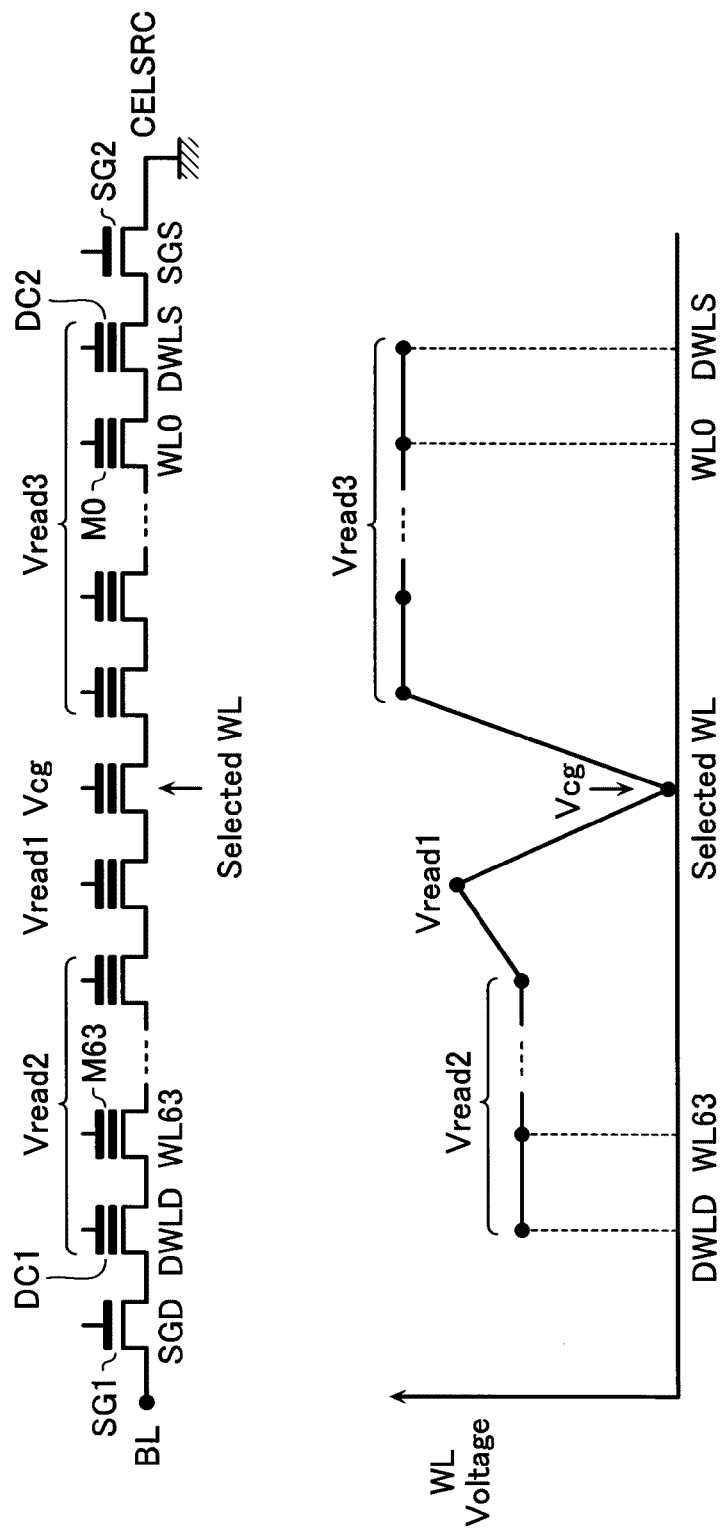
FIG. 6 shows a voltage distribution in a NAND string at a read time in accordance with embodying mode 4.

FIG. 6 shows an example in which dummy cells DC1 and DC2 are disposed adjacent to the select gate transistor SG1 and SG2, respectively, on the both ends of the NAND string. In this case, it is assumed that a NAND string has 64 memory cells M0-M63. Dummy cells DC1 and DC2 are formed as similar to the normal cells and disposed for preventing the adjacent memory cells M63 and M0, respectively, from being erroneously written. These dummy cells are not used for data storing, but it is required of these dummy cells to serve as pass transistors at a read time. Therefore, control gates of these dummy cells DC1 and DC2 are coupled to dummy word lines DWLD and DWLS, respectively, which are disposed in parallel with word lines.

The read bias scheme shown in FIG. 6 is basically the same as that of the embodying mode 1 shown in FIG. 1. Dummy word line DWLS on the select gate line SGS side is applied with read pass voltage Vread3 as well as the unselected word line WL0 adjacent to DWLS while dummy word line DWLD on the select gate line SGD side is applied with read pass voltage Vread2 as well as the unselected word line WL63 adjacent to DWLD.

Dummy cells DC1 and DC2 are not used for storing data, but these are used in an erase mode. Therefore, although the channel resistances thereof do not become problematic, securing sufficient cell current as well as the embodying mode 1, the reliability of data read will be improved.

The schemes in the embodying modes 2 and 3 explained with reference to FIGS. 2 and 3, respectively, may also be adaptable for the NAND string with the above-described dummy cells. That is, in addition to the bias conditions shown in FIGS. 2 and 3, dummy word line DWLS adjacent to the select gate line SGS is applied with read pass voltage Vread1, and dummy word line DWLD adjacent to the select gate line SGD is applied with read pass voltage Vread2 (not shown).

[Embodying Mode 5]

Figure 7:
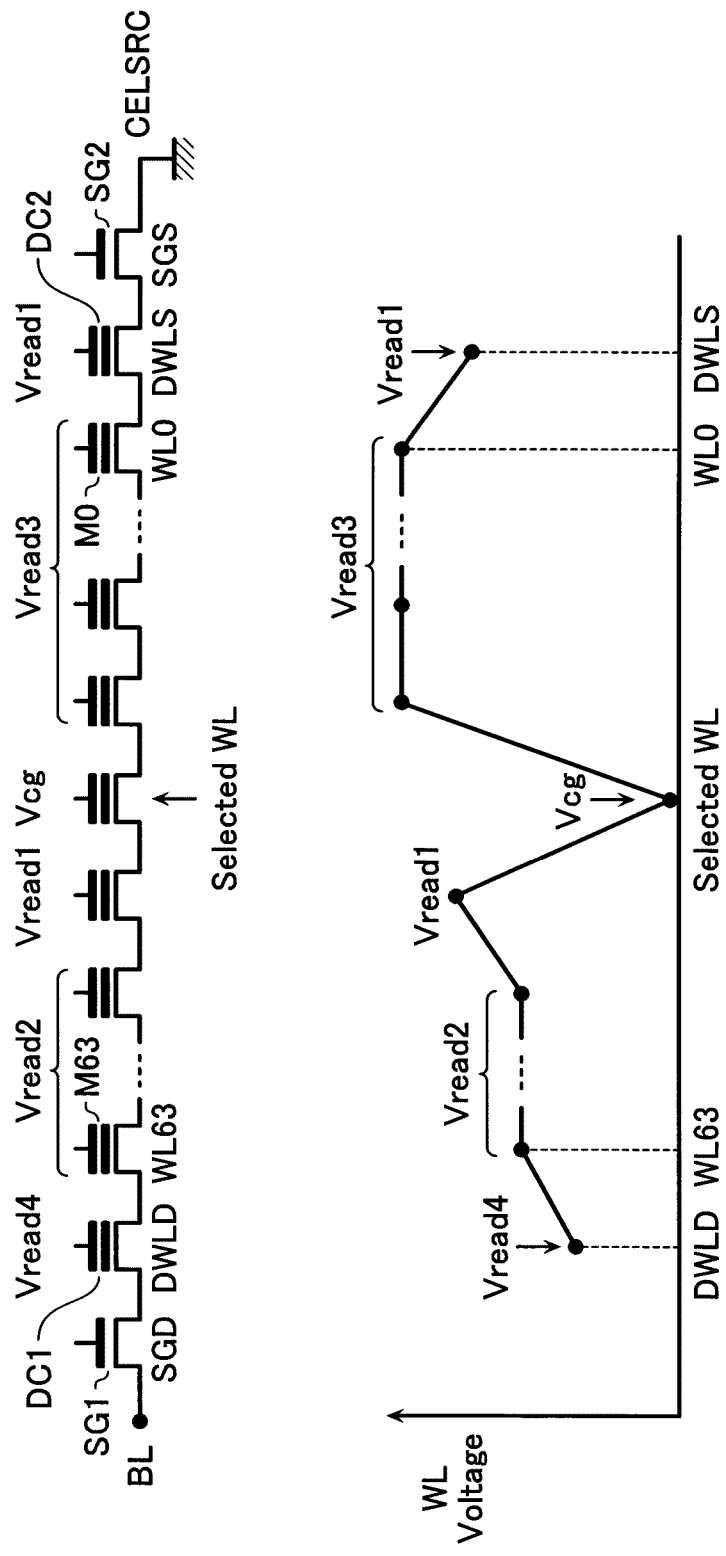
FIG. 7 shows a voltage distribution in a NAND string at a read time in accordance with embodying mode 5.

FIG. 7 shows another example, in which dummy cells DC1 and DC2 are disposed adjacent to the select gate transistor SG1 and SG2, respectively, on the both ends of the NAND string like that shown in FIG. 6.

As described above, dummy cells are made to operate in the erased state. Therefore, even if these are erroneously written due to GIDL (Gate Induced Drain Leakage) current, the threshold voltage does not become too high. By reason of this, it is allowed to apply a relatively low read pass voltage to the dummy word lines DWLD and DWLS.

In the example shown in FIG. 7, dummy word line DWLS on the select gate line SGS is applied with read pass voltage Vread1 lower than Vread3 applied to unselected word line WL0 adjacent to the dummy word line DWLS; and dummy word line DWLD on the select gate line SGD is applied with read pass voltage Vread4 lower than Vread2 applied to unselected word line WL63 adjacent to the dummy word line DWLD.

According to this embodying mode, although the read pass voltages become numerous, the erroneous writing stress in the dummy cells is suppressed, and the reliability of data read will be improved.

This embodying mode may also be adapted to the schemes explained with reference to FIGS. 2 and 3 in case the NAND string has dummy cells as similar to that shown in FIG. 7. That is, in addition to the bias conditions shown in FIGS. 2 and 3, dummy word line DWLS adjacent to the select gate line SGS is applied with read pass voltage Vread1, and dummy word line DWLD adjacent to the select gate line SGD is applied with read pass voltage Vread4 (not shown).

So far, various word line bias situations in the normal data read mode have been explained. The present invention may also be adaptable for the verify-read operation in a data write mode.

Figure 13:
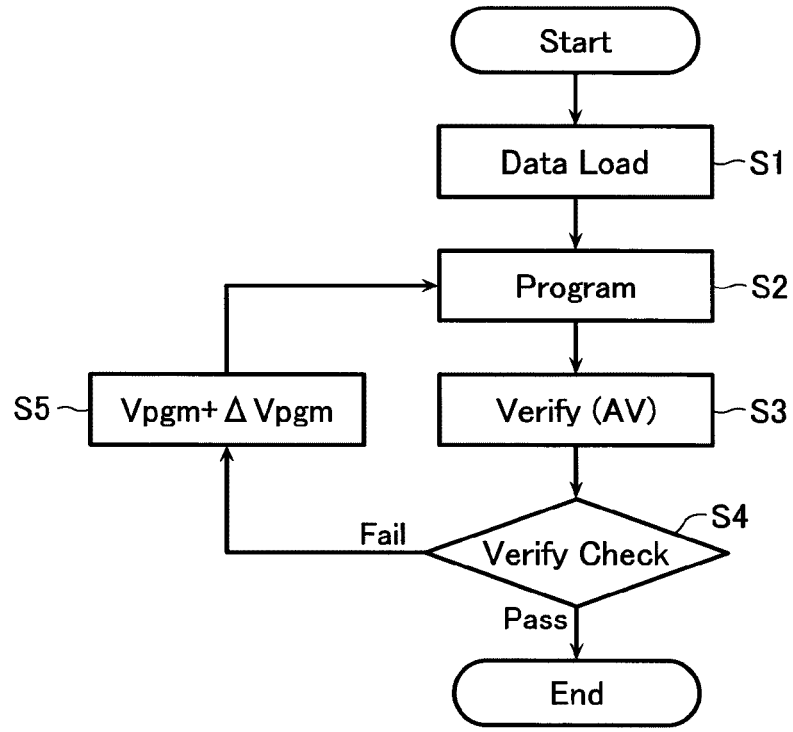
FIG. 13 shows a data write sequence of the flash memory.

For example, a data write sequence has, as shown in FIG. 13, one page write data loading step (S1); write pulse applying step (S2); verify-reading step (S3); and verify-checking step (S4). If there is insufficiently written cell, write voltage is stepped-up, and the write step will be repeated until when the verify passes.

At the write-verify read time, as shown in FIG. 10, verify-read voltage Vv different from the read voltage Vcg in the normal read mode is used for verifying the lower limit value of the data "0" threshold distribution. Unselected word lines are applied with a read pass voltage(s) as similar to the normal read case. Therefore, only replacing the read voltage Vcg with the verify-read voltage Vv, the above-described embodying modes are adaptable to the write-verify read operation.

Further, the present invention may be adapted to such a read scheme that cell current is made to flow from the common source line CELSRC with Vdd applied to the bit line BL. In this case, a selected word line is applied with, for example, the power supply voltage Vdd; and unselected word lines with read pass voltage Vread. Considering the read pass voltage Vread as well as in the above-described embodying modes, the same effect as the above-described embodying modes will be obtained.

Additionally, the present invention may be adapted to the NAND-type flash memory with a multi-level data storage scheme only taking into consideration the absolute values of the read voltage and read pass voltage.

Figure 14:
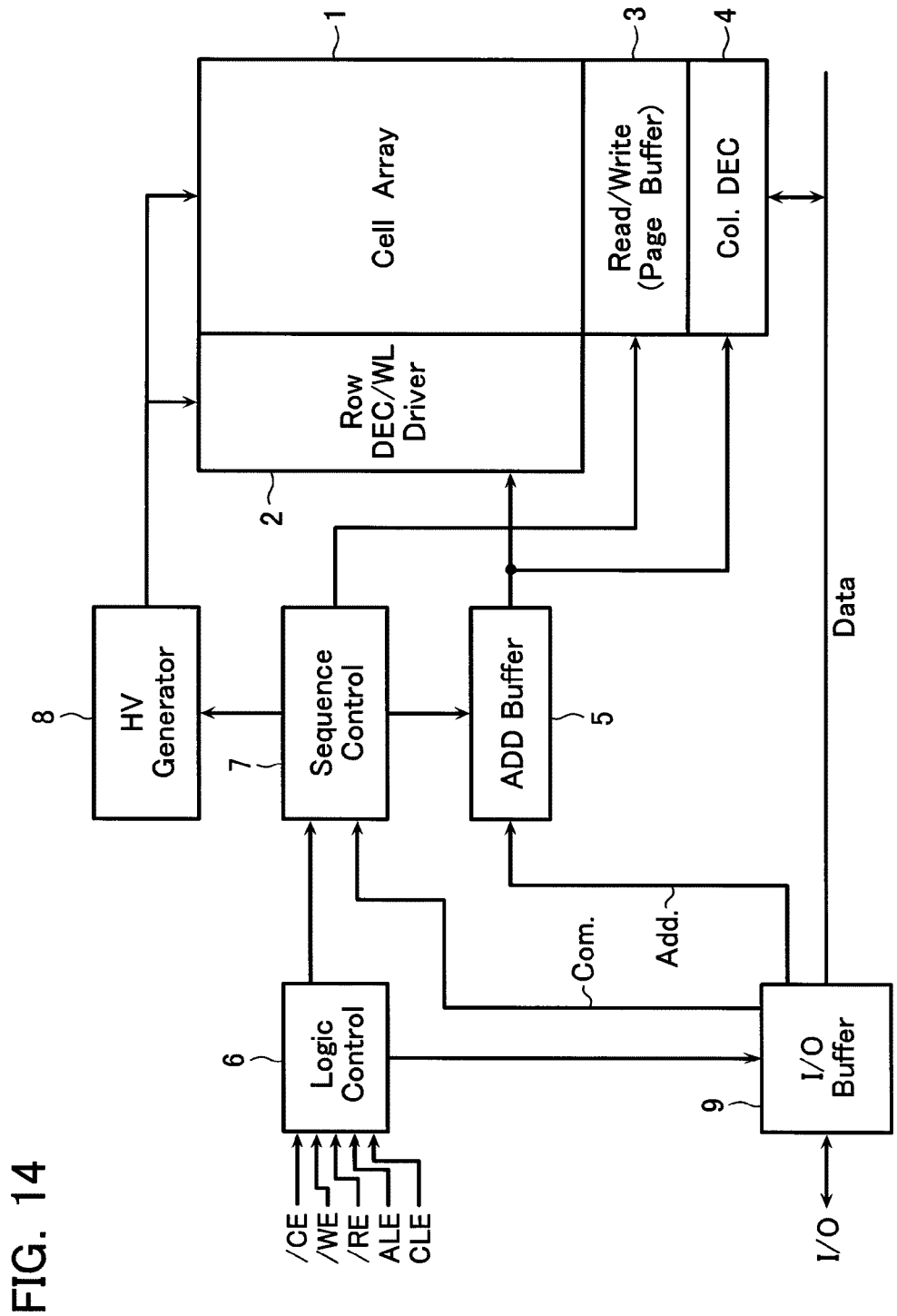
FIG. 14 shows the functional block configuration of the flash memory.

FIG. 14 shows a functional block configuration of the NAND-type flash memory in accordance with the above-described embodying modes 1-5.

Memory cell array 1, row decoder 2 and sense amplifier circuit 3 constitute the memory core as described above. Sequence controller (i.e., internal control circuit) 7 controls read, write and erase operations of the memory core.

The page buffer 3 has data hold circuits for one page, which is used for data reading and data writing for each one page of the memory cell array 1. One page read data of the page buffer 3 are sequentially selected by a column decoder 4 to be output to external I/O terminals through an I/O buffer 9. Write data supplied from the I/O terminals are selected by the column decoder 4 to be loaded in the page buffer 3.

Address "Add." and command "Com." are input through I/O buffer 9 to be transferred to address buffer 5 and controller 7, respectively. Row address and column address are transferred to the row decoder 2 and column decoder 4.

Logic controller 6 controls for command inputting, address inputting and data inputting/outputting in response to external control signals such as chip enable signal/CE, command latch enable signal CLE, address latch enable signal ALE, write enable signal/WE, read enable signal/RE and the like. Read and write operations are performed in accordance with command "Com". In response to the command, sequence controller 7 executes read control and sequence control of data write and data erase.

A high voltage generator 8 is controlled by the controller 7 to output predetermined voltages necessary for many kinds of operations.

[Application Devices]

As an embodiment, an electric card using the non-volatile semiconductor memory devices according to the above-described embodying modes 1-5 of the present invention and an electric device using the card will be described bellow.

Figure 15:
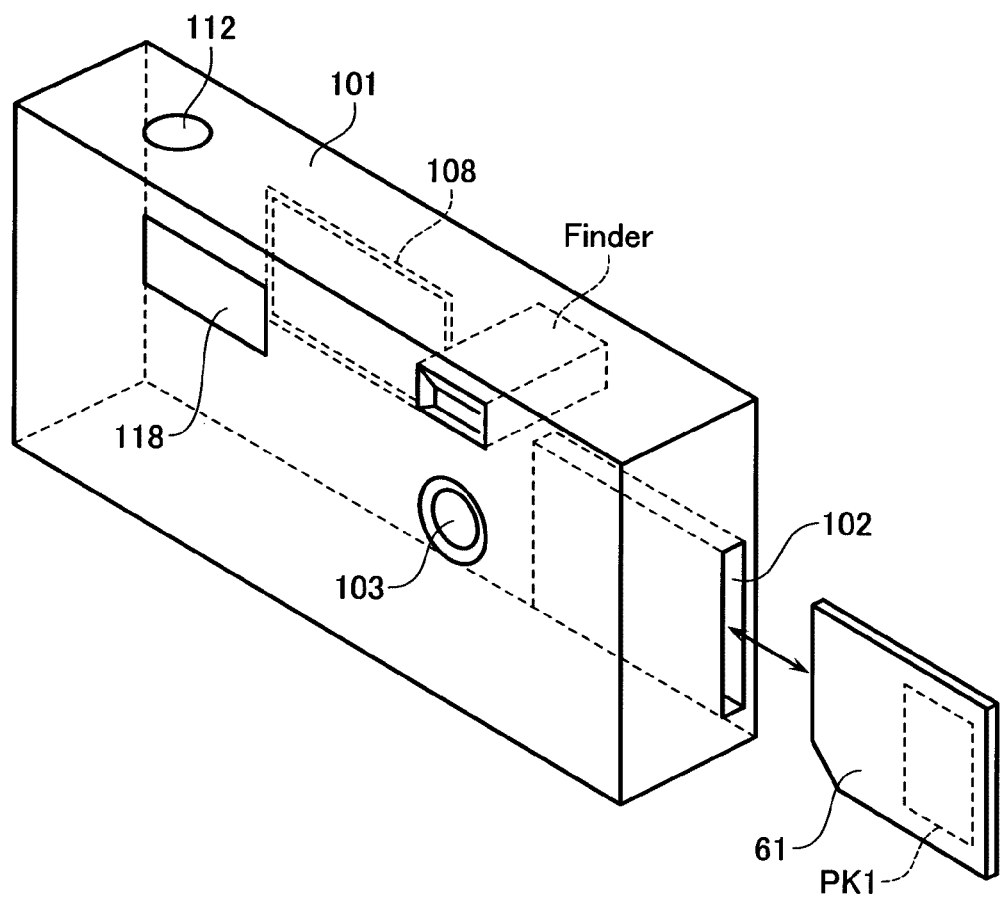
FIG. 15 shows another embodiment applied to a digital still camera.

FIG. 15 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 16:
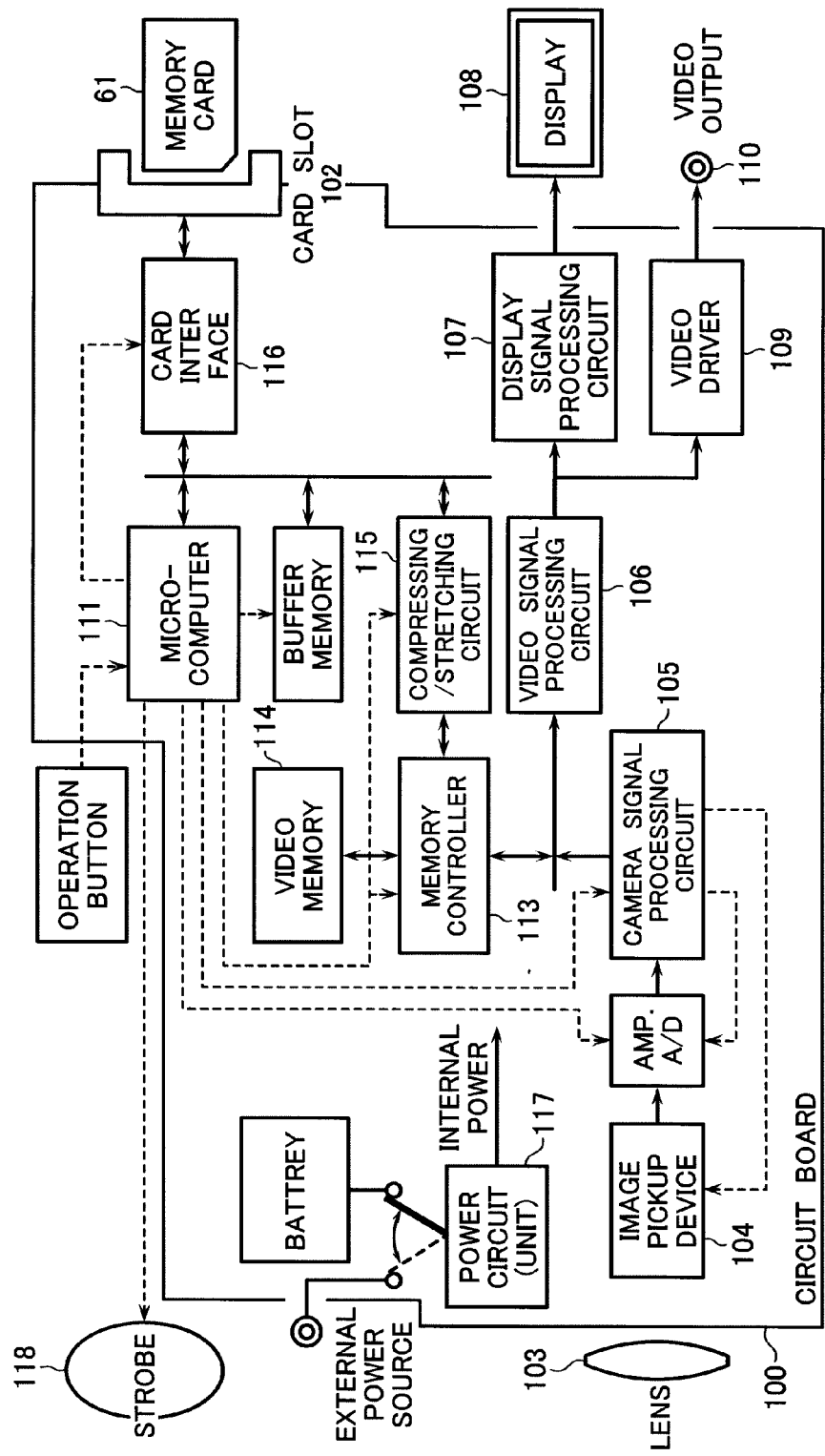
FIG. 16 shows the internal configuration of the digital still camera.
Figure 17A:
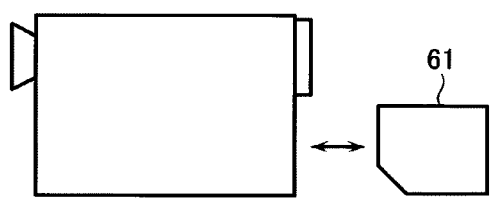
FIGS. 17A to 17J show other electric devices to which the embodiment is applied.
Figure 17F:
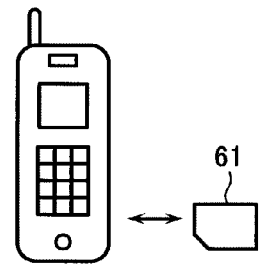
Figure 17B:
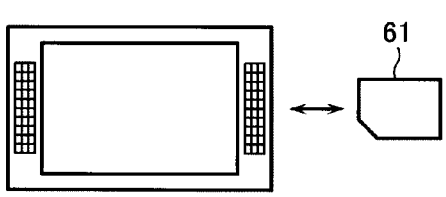
Figure 17G:
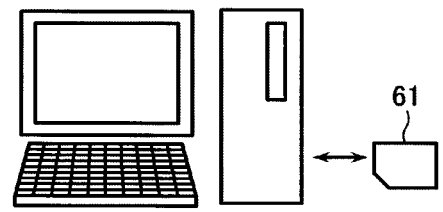
Figure 17C:
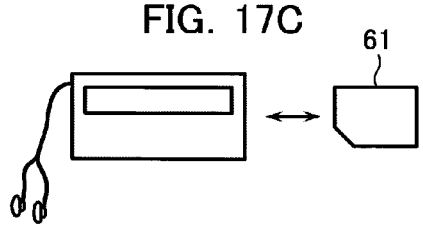
Figure 17H:
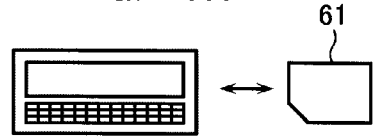
Figure 17D:
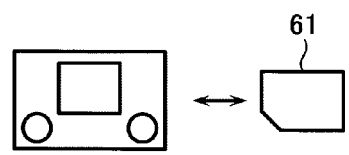
Figure 17I:
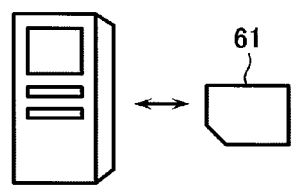
Figure 17E:
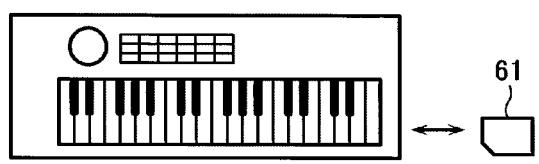
Figure 17J:
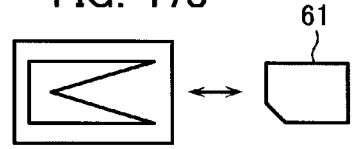

FIG. 16 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 17A to 17J, as well as in portable electric devices. That is, the electric card can also be used in a video camera shown in FIG. 17A, a television set shown in FIG. 17B, an audio apparatus shown in FIG. 17C, a game apparatus shown in FIG. 17D, an electric musical instrument shown in FIG. 17E, a cell phone shown in FIG. 17F, a personal computer shown in FIG. 17G, a personal digital assistant (PDA) shown in FIG. 17H, a voice recorder shown in FIG. 17I, and a PC card shown in FIG. 17J.

This invention is not limited to the above-described embodiment. It will be understood by those skilled in the art that various changes in form and detail may be made without departing from the spirit, scope, and teaching of the invention.

What is claimed is:

1. A reading method of a non-volatile semiconductor memory device, the memory device including a NAND string which has a plurality of memory cells disposed in series and first and second select gate transistors disposed on the both ends of the memory cells; a plurality of word lines coupled to the respective memory cells; and first and second select gate lines coupled to the first and second select gate transistors, respectively, the method comprising:
   applying a read voltage to a selected word line;
   applying a first read pass voltage to one adjacent to the selected word line within first unselected word lines disposed on the first select gate line side of the selected word line while applying a second read pass voltage lower than the first read pass voltage to the others;
   applying a third read pass voltage higher than the first read voltage to second unselected word lines disposed on the second select gate line side of the selected word line,
   wherein the NAND string further includes a first dummy cell disposed between the first select gate transistor and the neighboring memory cell; and a second dummy cell disposed between the second select gate transistor and the neighboring memory cell, the control gates of the first and second dummy cells being coupled to first and second dummy word lines, respectively, and
   wherein the method further comprises applying the second read pass voltage to the first dummy word line while applying the third read pass voltage to the second dummy word line.

2. The reading method according to claim 1, wherein in case the selected word line is one nearest to the first select gate line, applying the third read pass voltage to the whole unselected word lines.

3. The reading method according to claim 1, wherein in case the selected word line is one nearest to the second select gate line, applying the first read pass voltage to one adjacent to the selected word line within the first unselected word lines while applying the second read pass voltage to the others.

4. The reading method according to claim 1, wherein the method is executed for a verify-read in a data write sequence.

5. A reading method of a non-volatile semiconductor memory device, the memory device including a NAND string which has a plurality of memory cells disposed in series and first and second select gate transistors disposed on the both ends of the memory cells; a plurality of word lines coupled to the respective memory cells; and first and second select gate lines coupled to the first and second select gate transistors, respectively, the method comprising:
   applying a read voltage to a selected word line;
   applying a first read pass voltage to one adjacent to the selected word line within first unselected word lines disposed on the first select gate line side of the selected word line while applying a second read pass voltage lower than the first read pass voltage to the others;
   applying a third read pass voltage higher than the first read voltage to second unselected word lines disposed on the second select gate line side of the selected word line;
   wherein the NAND string further includes a first dummy cell disposed between the first select gate transistor and the neighboring memory cell; and a second dummy cell disposed between the second select gate transistor and the neighboring memory cell, the control gates of the first and second dummy cells being coupled to first and second dummy word lines, respectively, and
   wherein the method further comprises applying a fourth read pass voltage lower than the second read pass voltage to the first dummy word line while applying the first read pass voltage to the second dummy word line.

6. A reading method of a non-volatile semiconductor memory device, the device including a NAND string which has a plurality of memory cells disposed in series and first and second select gate transistors disposed on the both ends of the memory cells; a plurality of word lines coupled to the respective memory cells; and first and second select gate lines coupled to the first and second select gate transistors, respectively, the method comprising:

applying a read voltage to a selected word line;

applying a first read pass voltage to one adjacent to the selected word line within first unselected word lines disposed on the first select gate line side of the selected word line while applying a second read pass voltage lower than the first read pass voltage to the others; and applying the first read pass voltage to second unselected word lines disposed on the second select gate line side of the selected word line.

7. The method according to claim 6, wherein the NAND string further includes a first dummy cell disposed between the first select gate transistor and the neighboring memory cell; and a second dummy cell disposed between the second select gate transistor and the neighboring memory cell, the control gates of the first and second dummy cells being coupled to first and second dummy word lines, respectively, and wherein the method further comprises applying the first read pass voltage to the first dummy word line while applying the first read pass voltage to the second dummy word line.

8. The reading method according to claim 6, wherein the NAND string further includes a first dummy cell disposed between the first select gate transistor and the neighboring memory cell; and a second dummy cell disposed between the second select gate transistor and the neighboring memory cell, the control gates of the first and second dummy cells being coupled to first and second dummy word lines, respectively, and wherein the method further comprises applying a fourth read pass voltage lower than the second read pass voltage to the first dummy word line while applying the first read pass voltage to the second dummy word line.

9. The reading method according to claim 6, wherein the method is executed for a verify-read in a data write sequence.

10. A reading method of a non-volatile semiconductor memory device, the device including a NAND string which has a plurality of memory cells disposed in series and first and second select gate transistors disposed on the both ends of the memory cells; a plurality of word lines coupled to the respective memory cells; and first and second select gate lines coupled to the first and second select gate transistors, respectively, the method comprising:

applying a read voltage to a selected word line;

applying a first read pass voltage to one adjacent to the selected word line within first unselected word lines disposed on the first select gate line side of the selected word line while applying a second read pass voltage lower than the first read pass voltage to the others; and applying third read pass voltage higher than the first read pass voltage to one adjacent to the selected word line within second unselected word lines disposed on the second select gate line side of the selected word line while applying the first read pass voltage to the others.

11. The reading method according to claim 10, wherein the NAND string further includes a first dummy cell disposed between the first select gate transistor and the neighboring memory cell; and a second dummy cell disposed between the second select gate transistor and the neighboring memory cell, the control gates of the first and second dummy cells being coupled to first and second dummy word lines, respectively, and wherein the method further comprises applying the second read pass voltage to the first dummy word line while applying the first read pass voltage to the second dummy word line.

12. The reading method according to claim 10, wherein the NAND string further includes a first dummy cell disposed between the first select gate transistor and the neighboring memory cell; and a second dummy cell disposed between the second select gate transistor and the neighboring memory cell, the control gates of the first and second dummy cells being coupled to first and second dummy word lines, respectively, and wherein the method further comprises applying a fourth read pass voltage lower than the second read voltage to the first dummy word line while applying the first read pass voltage to the second dummy word line.

13. The reading method according to claim 10, wherein the method is executed for a verify-read in a data write sequence.

* * * * *